(12) United States Patent
Sotiriou

(10) Patent No.: US 7,711,513 B2
(45) Date of Patent: May 4, 2010

(54) SYSTEM AND METHOD OF DETERMINING THE SPEED OF DIGITAL APPLICATION SPECIFIC INTEGRATED CIRCUITS

(75) Inventor: Christos P. Sotiriou, Heraklion, Crete (GR)

(73) Assignee: Institute of Computer Science, Foundation for Research and Technology -Hellas, Heraklion (GR)

( * ) Notice: Subject to any disclaimer, the term of this patent is extended or adjusted under 35 U.S.C. 154(b) by 220 days.

(21) Appl. No.: 12/000,734

(22) Filed: Dec. 17, 2007

(65) Prior Publication Data
US 2008/0288203 A1 Nov. 20, 2008

Related U.S. Application Data

(63) Continuation-in-part of application No. 11/283,070, filed on Nov. 21, 2005, now abandoned.

(60) Provisional application No. 60/642,990, filed on Jan. 12, 2005.

(51) Int. Cl.
*G06F 19/00* (2006.01)
(52) U.S. Cl. .......................................... 702/118; 326/93
(58) Field of Classification Search ................. 702/118, 702/182–185, 188, 76, 77; 326/93
See application file for complete search history.

(56) References Cited

U.S. PATENT DOCUMENTS

| | | | |
|---|---|---|---|
| 4,686,392 A | 8/1987 | Lo | |
| 5,250,856 A | 10/1993 | Burton et al. | |
| 5,305,463 A | 4/1994 | Fant et al. | |
| 5,845,109 A | 12/1998 | Suzuki et al. | |
| 6,043,674 A | 3/2000 | Sobelman | |
| 6,075,389 A | 6/2000 | Umemoto et al. | |
| 6,088,830 A | 7/2000 | Blomgren et al. | |
| 6,133,761 A | 10/2000 | Matsubara | |
| 6,166,990 A * | 12/2000 | Ooishi et al. | ........... 365/233.11 |
| 6,349,387 B1 | 2/2002 | Blomgren | |
| 6,509,761 B2 | 1/2003 | Taki | |
| 6,526,542 B2 | 2/2003 | Kondratyet | |
| 6,665,222 B2 * | 12/2003 | Wright et al. | ................ 365/194 |
| 6,807,509 B2 | 10/2004 | Bourdin et al. | |
| 6,819,150 B1 | 11/2004 | Santosa et al. | |
| 6,891,410 B2 | 5/2005 | Sadowski | |

(Continued)

OTHER PUBLICATIONS

PCT Search Report.

(Continued)

*Primary Examiner*—Edward Raymond
(74) *Attorney, Agent, or Firm*—Steptoe & Johnson LLP

(57) ABSTRACT

According to one embodiment of the present invention, a system for identifying a running speed of an integrated circuit is provided. An asynchronous multi-rail circuit is configured to receive input data and transmit output data. A completion detection circuit is configured to generate a completion detection signal for the asynchronous multi-rail circuit. A variable clock generator configured to be driven by at least the completion detection signal. A synchronous circuit element configured to receive at least a portion of the output data and configured to be clock driven by a clock signal from the variable clock generator. A period of the clock signal represents a running speed of the asynchronous circuit.

7 Claims, 7 Drawing Sheets

U.S. PATENT DOCUMENTS

| | | | |
|---|---|---|---|
| 6,964,003 B2 | 11/2005 | Thiebeault | |
| 2002/0188912 A1* | 12/2002 | Kondratyev | 716/2 |
| 2003/0076131 A1* | 4/2003 | Greenstreet et al. | 326/93 |

OTHER PUBLICATIONS

I. Blunno, J. Cortadella, A. Kondratyev, L. Lavagno, K. Lwin, and C. Sotiriou. Handshake Protocols for De-Synchronization. In *Proc. International Symposium on Advanced Research in Asynchronous Circuits and Systems*, pp. 149-158, IEEE Computer Society Press, Apr. 2004.

User Guide. In *Celtic User Manual, Cadence Design Systems, Inc.*, 2004.

D. Chinnery and K. Keutzer. Reducing the Timing Overhead. In *Closing the Gap between ASIC and Custom*: Tools and Techniques for High-Performance ASIC Design, chapter 3. Kluwer Academic Publishers, 2002.

J. Cortadella, A. Kondratyev, L. Lavagno, and C. Sotiriou. Coping with the Variability of Combinational Logic Delays. In *Proc. International Conf. Computer Design (ICCD)*, Oct. 2004.

S. Devadas and K. Keutzer. Synthesis of Robust Delay-Fault Testable Circuits: Theory. *IEEE Transactions on Computer-Aided Design*, 11 (1):87-101, Jan. 1992.

Y. Kukimoto, R.K. Brayton, and P. Sawkar. Delay-Optimal Technology Mapping by DAG Covering. In *Design Automation Conference*, pp. 348-351, 1998.

Alex Kondratyev and Kelvin Lwin. Design of Asynchronous Circuits by Synchronous CAD Tools. In *Proc. ACM/IEEE Design Automation Conference*, Jun. 2002.

D. S. Kung. Hazard-Non-Increasing Gate-Level Optimization Algorithms. In *Proc. International Conf. Computer-Aided Design (ICCAD)*, pp. 631-634, 1992.

E. Lehman, Y. Watanabe, J. Grodstein, and H. Harkness. Logic Decomposition During Technology Mapping. *Ieee Transactions on Computer-Aided Design*, 16(8):813-834, Aug. 1997.

S.R Nassif. Modeling and Forecasting of Manufacturing Variations, Proceedings of the ASP-DAC 2001 *Asia and South Pacific Design Automation Conference*, Jan. 30-Feb. 2, 2001, pp. 145-149.

R. Puri, A. Bjorksten, and T. Rosser. Logic Optimization by Output Phase Assignment in Dynamic Logic Synthesis. In *Proc. International Conf. Computer-Aided Design (ICCAD)*, pp. 2-8, 1996.

M. Prasad, D. Kirkpatrick, R.Brayton, and A. Sangiovanni Vincentelli. Domino. Logic Synthesis and Technology Mapping. In *Proc. International Workshop on Logic Synthesis*, vol. 1, 1997.

Jens Sparsø and Jørgen Staunstrup. Delay-Insensitive Multi-Ring Structures. *Integration, the VLSI journal*, 15(3):313-340, Oct. 1993.

E. M. Sentovich, K. J. Singh, L. Lavagno, C. Moon, R. Murgai, A. Saldanha, H. Savoj, P. R. Stephan, R. K. Brayton, and A. Sangiovanni-Vincentelli. SIS: A System for Sequential Circuit Synthesis. Technical report, U.C. Berkeley, May 1992.

Ivan E. Sutherland. Micropipelines. *Communications of the ACM*, 32(6):720-738, Jun. 1989.

M. A. Thornton, K. Fazel, R. B. Reese, and C. Traver. Generalized Early Evaluation in Self-Timed Circuits. In *Proc. Design, Automation and Test in Europe (DATE)*, pp. 255-259, Mar. 2002.

S. H. Unger. Asynchronous Sequential Switching Circuits. Wiley-Interscience, John Wiley & Sons, Inc., New York, 1969.

Victor I. Varshavsky, editor. *Self-Timed Control of Concurrent Processes*: The Design of Aperiodic Logical Circuits in Computers and Discrete Systems. Kluwer Academic Publishers, Dordrecht, The Netherlands, 1990, Chapters 3 and 4.

R. K. Brayton et al, Multilevel Logic Synthesis, Proceedings of the IEEE, vol. 78, No. 2, Feb. 1990.

* cited by examiner

SYSTEM AND METHOD OF DETERMINING THE SPEED OF DIGITAL APPLICATION SPECIFIC INTEGRATED CIRCUITS

CROSS-REFERENCE TO RELATED APPLICATIONS

The present application is a continuation-in-part of U.S. patent application Ser. No. 11/283,070, filed on Nov. 21, 2005 now abandoned, which claims priority under 35 U.S.C. §120 to U.S. Provisional Patent Application Ser. No. 60/642,990, filed on Jan. 12, 2005, the disclosures of which are expressly incorporated by reference herein in their entirety.

BACKGROUND OF THE INVENTION

1. Field of the Invention

The present invention relates to determining the running speed of an integrated circuit. More specifically, the present invention relates to an integrated circuit with an internal clocking system where the clock period represents the speed of the clocked circuit.

2. Discussion of Background Information

Integrated circuits made according to the same manufacturing process are typically not created equal. Due to various imperfections in the manufacturing process from one lot of chips to the next, and even with the same lots, individual chips may have different running speeds. The computing market has been able to take advantage of this manufacturing flaw by charging more for faster chips and less for slower chips. This market segmentation requires sorting the chips into different speed classifications.

It is common to identify timing bins with two or more clock speed reference points for the ICs operation. For example, a fast bin for chips which operate faster than expected, a nominal bin for chips that operate at the expected speed, and a slow bin for chips that operate slower than expected. A practical example is the Pentium 4 processor chip, whereby the same manufactured circuit is binned at steps of 200 MHz, e.g., 2.8 GHz goes into the fast bin and will be the most expensive chips with the lowest timing yield, 2.6 GHz goes into the nominal bin and will be cheaper than the 2.8 GHz chip, and 2.4 GHz chips will go to the slow bin and be the cheapest of the three. Another example is the Intel Centrino processor with speed bins at 1.1 GHz, 1.2 GHz and 1.5 GHz.

Currently manufactured IC's do not have the ability to communicate their running speed. Empirical methods are used in that the same IC is tested repeatedly at different speeds to determine if the chip works reliably or not at that speed. Thus for example, an IC which operates reliably and consistently when tested at 2.4 GHz but erratically or not at all at 2.6 GHz indicates that the chips' actual speed is somewhere between 2.4 and 2.6 GHz. The chip could be accepted as a 2.4 GHz chip, or tested to further narrow its operating range (e.g., whether the chip works reliably between 2.4 and 2.5 GHz). Ultimately the chip is labeled at a speed of the lower of the selected range, as opposed to its actual running speed. It is therefore not uncommon for chips to be able to operate faster than their advertised running speed. It is also not uncommon for users to modify their system to "overclock" their PC to access the additional speed potential.

SUMMARY OF THE INVENTION

According to one embodiment of the present invention, a system for identifying a running speed of an integrated circuit is provided. An asynchronous multi-rail circuit is configured to receive input data and transmit output data. A completion detection circuit is configured to generate a completion detection signal for the asynchronous multi-rail circuit. A variable clock generator configured to be driven by at least the completion detection signal. A synchronous circuit element configured to receive at least a portion of the output data and configured to be clock driven by a clock signal from the variable clock generator. A period of the clock signal represents a running speed of the asynchronous circuit.

The above embodiment may have various optional features. The synchronous circuit element may be a flip-flop. A variable power supply may be configured to power the asynchronous multi-rail circuit and the running speed of the circuit increases in response to increases in the variable power supply, and decreases in response to decreases in the variable power supply. The asynchronous multi-rail circuit may be monotomic. The asynchronous multi-rail circuit may have a critical path, wherein the running speed is at a minimum when a critical input vector is applied to the asynchronous multi-rail circuit.

The asynchronous multi-rail circuit may comprise at least first and second asynchronous multi-rail circuits, the completion detection circuit may comprise at least first and second completion detection circuits configured to generate at least first and second completion detection signals for the at least first and second asynchronous circuits, respectively, and the variable clock generator may comprises at least first and second variable clock generators configured to be driven by at least the at least first and second completion detection signals, respectively, such that a running speed of the clock signal is based upon at least a processing speed of a slowest one of the at least first and second asynchronous multi-rail circuits. The at least first and second asynchronous multi-rail circuits contain at least one critical path, wherein the running speed is at a minimum in response to a critical input vector.

According to another embodiment of the invention, a method for determining a minimum running speed of an integrated circuit is provided. The method includes identifying at least one critical path in the integrated circuit, selecting at least one critical test vector for each of the at least one critical path, applying the at least one critical test vector to the circuit under ambient conditions; and outputting at least one clock speed for each of the at least one critical input vector applied during the applying, and identifying the individual clock speed from the at least one clock speed with the largest period, wherein a period of the individual clock speed represents the minimum running speed of the circuit under the ambient external conditions.

The above embodiment may have various optional features. The ambient external conditions, including temperature and power supply, can be modified to thereby change the speed of the circuit. A plurality of speed ranges can be established, the minimum running speed of the circuit can be compared with the plurality of speed ranges to identify a corresponding speed range, and the circuit can be sorted based on the corresponding speed range identified by the comparison.

According to yet another embodiment of the invention, a system for identifying a running speed of an integrated circuit is provided. A plurality of logic circuits are provided. A plurality of delay circuits corresponding to respective ones of the plurality of logic circuits are also provided. A plurality of variable clock generators are each driven based on at least the plurality of delay circuits, respectively. The plurality of variable clock generators will synchronize to a running speed based substantially on a processing speed of an individual one of the plurality of delay circuits with the longest delay. A period of the clock signal represents a running speed based on the individual one of the plurality of delay circuits.

The above embodiment may have various optional features. A plurality of synchronous circuit elements may be configured to receive at least a portion of output data from the plurality of logic circuits, respectively, and configured to be clock driven by a clock signal from the plurality of variable clock generators, respectively. The plurality of synchronous circuit elements may be flip-flops. A variable power supply may be configured to power the multi-rail monotonic circuit, such that a running speed of the circuit increases in response to increases in the variable power supply, and decreases in response to decreases in the variable power supply. Each of the plurality of delay circuits may have a delay that is greater than a maximum processing time of respective ones of the plurality of logic circuits, as well as substantially equal to the maximum processing time of respective ones of the plurality of logic circuits.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE EXEMPLARY EMBODIMENT

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
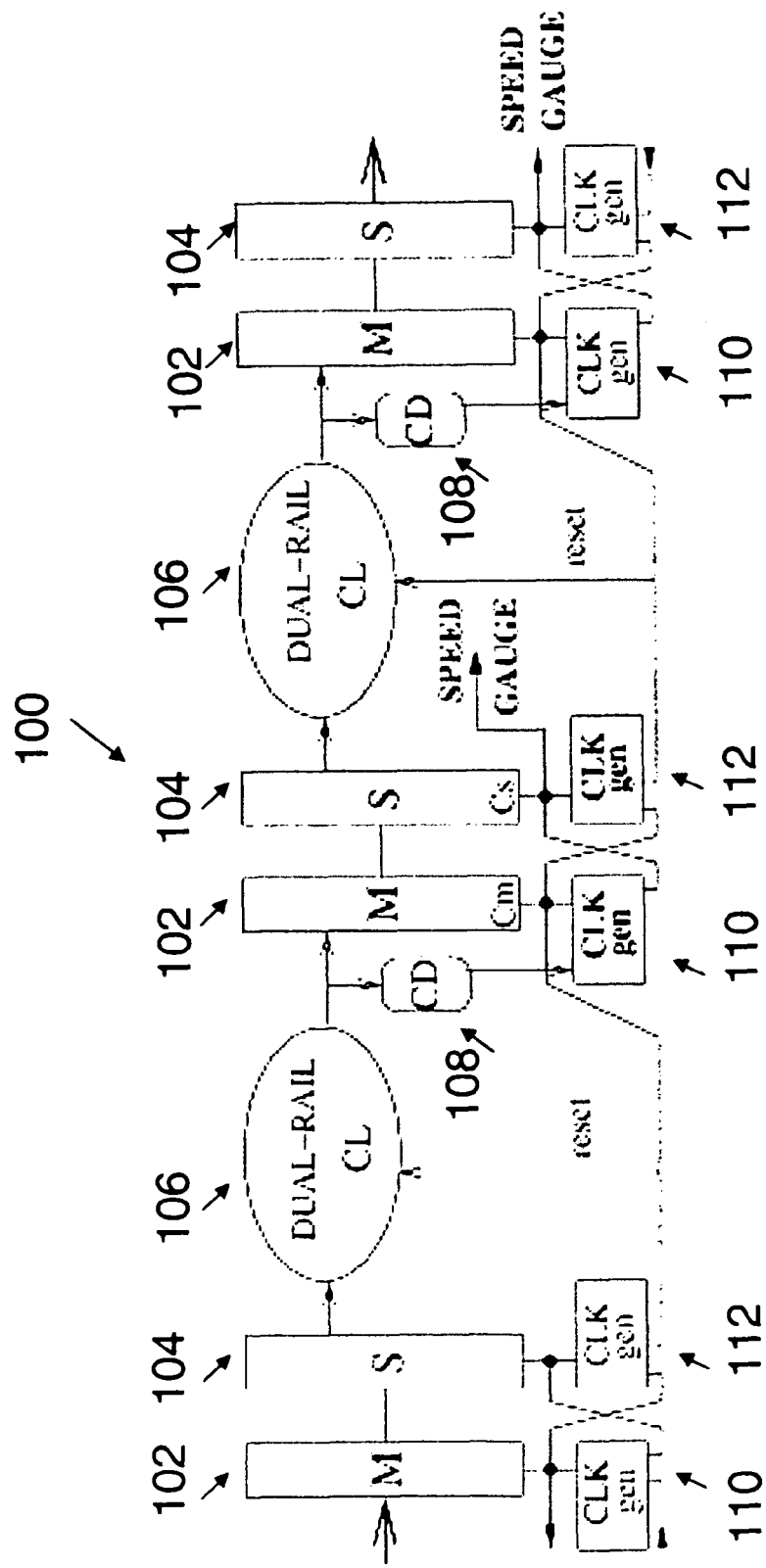
FIG. 1 illustrates a block diagram of an embodiment of the invention in a linear pipeline configuration.

Referring now to FIG. 1, an embodiment of the invention is shown in a linear pipeline structure collectively as circuit 100. A master flip-flop 102 receives input data from an upstream source. The data passes to a slave flip-flop 104, which in turn passes the input data to a circuit cloud 106. Circuit cloud 106 is preferably an asynchronous dual-rail monotomic circuit which process the input data into one or more output signals. The output signals then pass to both the next master flip-flop 102 in the pipeline and to completion detection circuitry 108.

The circuitry within circuit cloud 106 will initially be unstable as different input signals travel along different paths and reach the outputs at different times, often causing incorrect output signals. Eventually each circuit cloud 106 will complete its processing to the point that its output signal(s) will stabilize (e.g., because the circuit will complete processing or where any remaining processing will not effect the outputs). Completion detection circuitry 108 monitors the processing state of circuit cloud 106 and generates a completion detection signal when the outputs of circuit cloud 106 achieve this stable state. Individual circuit clouds 106 have whatever function they are designed for, and may be the same or different.

A master clock generator 110 provides the clock for master flip flop 102, and a slave clock generator 112 provides the clock for slave flip-flop 104. Both are variable clocks in that their speed is adjustable based on their inputs. Master clock generator 110 receives the completion detection signal associated with the circuit cloud 106 upstream from the corresponding master flip-flop 102, and the clock signal from slave clock generator 112 for the corresponding downstream slave flip-flop 104. Slave clock generator 112 receives as its inputs the clock signal from the master clock generators 110 for both the corresponding upstream and downstream master flip-flops 102.

When circuit 100 is initially activated, all of the variable clock generators 110 and 112 will be out of sync because each is driven by a local completion detection signal at its own unique time based on the processing speed of its corresponding circuit cloud 106. Adjacent variable clocks will then settle at the slower speed, e.g., the period of two interlocked pipelines will settle at the speed of the slower of the two. Eventually the entire circuit 100 will settle to the clock speed based on the slowest circuit cloud 106 as dictated by completion detection circuitry 108. Essentially the clock speed will match the speed of the completion detection circuitry 108, (subject to natural processing delays). The resulting clock speed can be monitored by connecting the output of any clock to an output pin and the period of the clock speed represents the running speed of the chip.

The running speed of circuit 100 is self-adjusting based on the nature of the input data. Some input data combinations will be more taxing than others, in that the input data exercises more or less gates within circuit clouds 106. The amount of time it takes to process one set of input signals as opposed to another directly affects the timing of the generation of the completion signals, which in turn directly affects the overall clock speed of the circuit. The clock speed will be faster for less taxing combinations of input data, and slower for more taxing combinations of input data.

While the speed of the integrated circuit may change based on the inputs, for purpose of marketing and sales it may nonetheless be desirable to know the minimum operating speed of the chip. The minimum operating speed would be the overall clock speed of circuit 100 under a worst-case scenario in which a particular input vector causes a particular circuit cloud(s) 106 to take the longest amount of time to process the input vector compared to the amount of time that it would take for any circuit cloud 106 to process any other input vector. This would in turn generate a completion detection signal with the longest (worst-case) period, and the entire circuit would slow to that corresponding clock speed. That speed represents the minimum overall speed of the circuit 100 under the then existing external conditions (e.g., power supply, temperature, etc.).

The worst-case scenario is based on a selection of an input vector which presents the most significant processing challenge to the circuit path(s) of circuit 100. A "critical path" is a circuit pathway within any particular circuit cloud 106 which has the most number of gates between the input and the output, compared to other paths in circuit 100. A "critical input vector" is an input vector designed to force the corresponding critical path to take the longest time to process as compared to any other input vector. Since a critical input vector propagating along a corresponding critical path will take the most time to process, the completion detection signals tend to generate at the slowest rate, which controls the overall clock speed of the circuit. Since the circuit will not operate any slower than this worst-case scenario, the resulting clock speed is the minimum speed of the circuit under the then existing environmental conditions.

Application of a single critical input vector to the most critical path is sufficient to obtain the minimum clock speed of the IC. However, there may be multiple critical paths with the same number of gates, such that each critical path would be tested with its own critical input vector and the lowest resulting clock speed would be selected. There may be multiple paths for which it is not clear whether or not one path is more critical than another, such that some or all could be tested. It may be desirable to test a group of the most critical paths (e.g., first through fourth most critical). Ultimately the number of input vectors selected and applied is up to the individual user/designer.

Selection of the critical input vector(s) that will most challenge the critical path(s) is selected using known techniques, such as critical path sensitization through SAT or any other valid delay fault test vector analysis. SAT stands through SATisfiability algorithms, which identify an input vector for a circuit such that an output function assumes the value 1. By way of non-limiting example, if a circuit has inputs a, b and c and output f, the SAT algorithm identifies an input vector for which f=1. This is related to the critical path, because once the critical path is selected it should be sensitized by deriving the combination that allows for the specific traversal of the circuit from inputs to outputs for a logic cloud. There may be several critical input vectors for a particular critical path.

Figure 2:
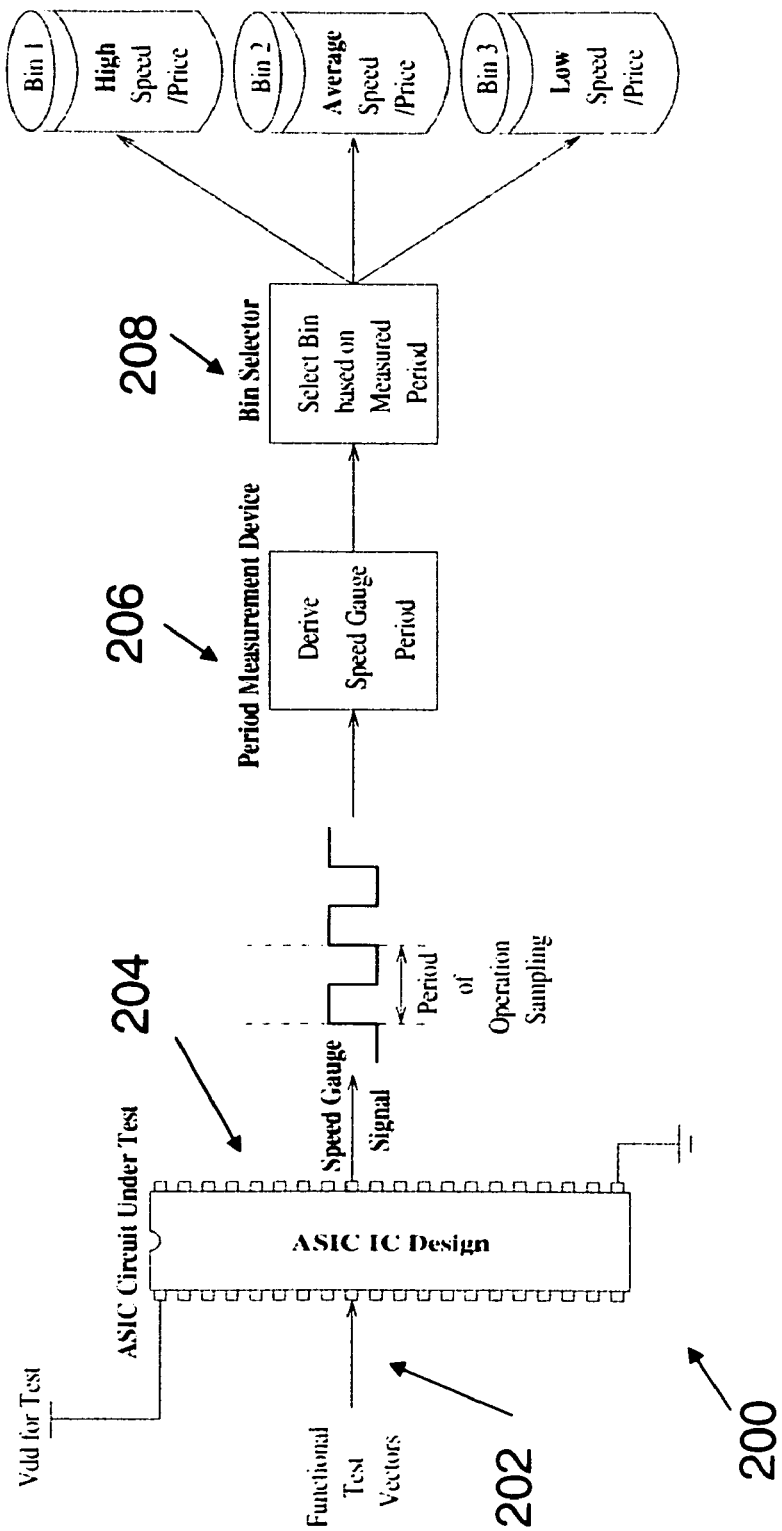
FIG. 2 illustrates applying one ore more input vectors to an integrated circuit chip and monitoring the resulting clock speed as an output.

FIG. 2 illustrates testing an integrated circuit chip 200 with circuit 100 therein with one or more applied input vectors 202. The resulting clock speed is monitored as an output 204. A period measuring device 206 measures the period of the clock to determine the clock speed. A bin selector 208 then sorts chips 200 based upon the measured minimum operating speed for appropriate pricing. FIG. 2 shows three (3) such bins, although any number may be used.

Integrated circuit 200 has no need for an external clock, and thus none is shown in FIG. 2. However, the invention does not exclude or preclude the application of a clock signal to chip 200 for other purposes.

The circuits within circuit clouds 106 of FIG. 1 are preferably dual-rail monotomic asynchronous circuits with a two-phase, NULL, DATA discipline in which completion detection is based on the state of the primary outputs of the circuit. Applicants' co-pending application Ser. No. 11/283,070 details several methods for designing such circuits. By way of non-limiting example, FIGS. 6A-6D illustrate the transformation of Boolean logic circuit for y=a$\bar{b}$+b(c+$\bar{d}$) into a monotomic dual-rail circuit with completion detection that could be used for circuit cloud 106 and completion detection circuitry 108. However, the invention is not so limited, and circuit cloud 106 may be any monotomic multi-rail circuit with completion detection, designed by any means. Completion detection circuitry 108 may be any circuit that detects completion, whether based on the primary outputs of circuit cloud 106, intermediate outputs within circuit cloud 106, or combinations of both. Completion detection circuitry 106 may be strongly indicating, or weakly indicating.

Circuit 100 can be designed using any known methodology. One such methodology is de-synchronization, in which a set of blocks operating using a single-global clock signal is converted to a set of blocks operating autonomously through communication between them by handshaking. Such a conversion technique is shown, for example, in In *Proc. International Symposium on Advanced Research in Asynchronous Circuits and Systems*, pages 149-158, IEEE Computer Society Press, April 2004, which is incorporated by reference herein in its entirety.

De-synchronization assures correct circuit behavior no matter what the connectivity between the blocks of the synchronous design are. The de-synchronization process typically consists of two steps, for fixed groups of sequential elements and combinational logic: conversion of the flip-flop-based synchronous circuit into a latch-based one; and decouple local clocks for master and slave latches (in a D-flip-flop they are both derived from the same clock) and introduce clock generation elements.

Figure 3A:
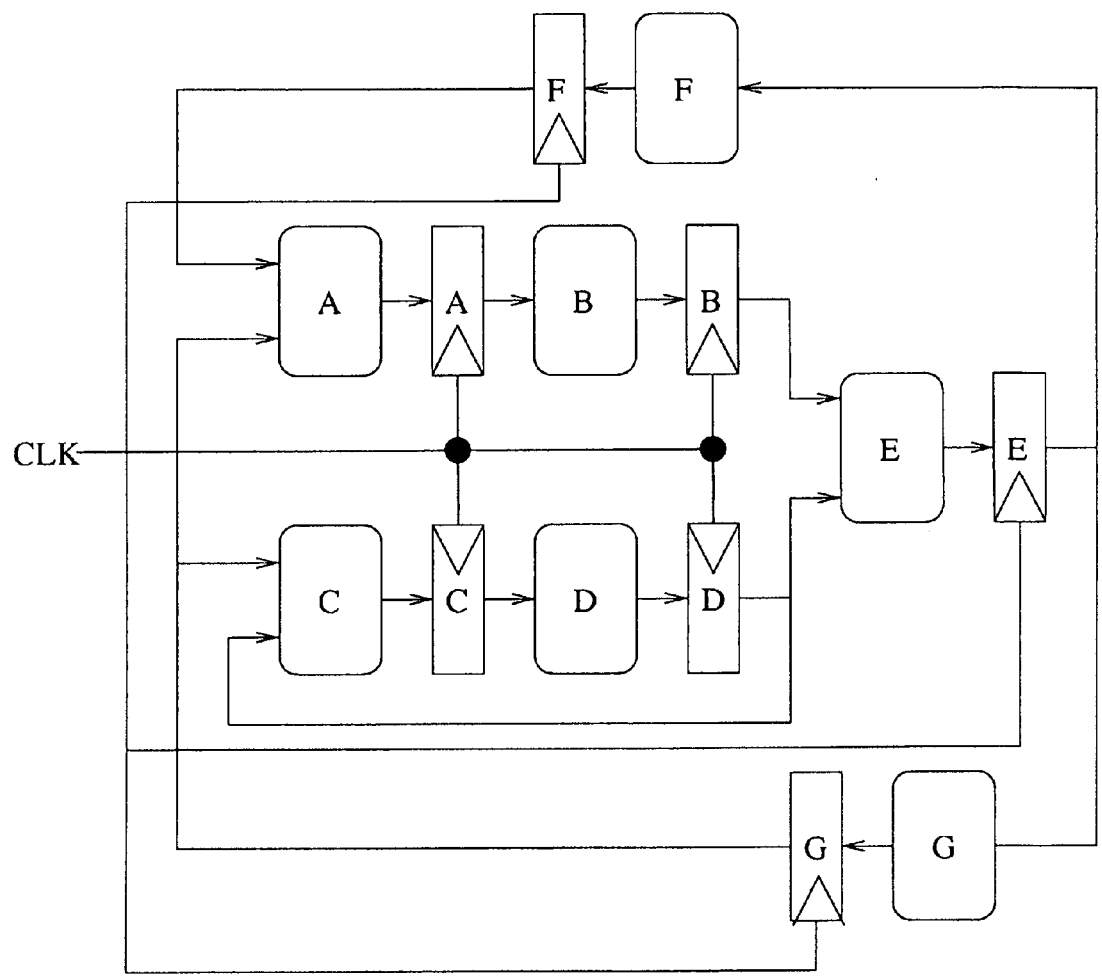
FIGS. 3A and 3B illustrates a conversion process from a set of blocks operating using a single-global clock signal to a set of block operating autonomously through communication between them by handshaking.
Figure 3B:
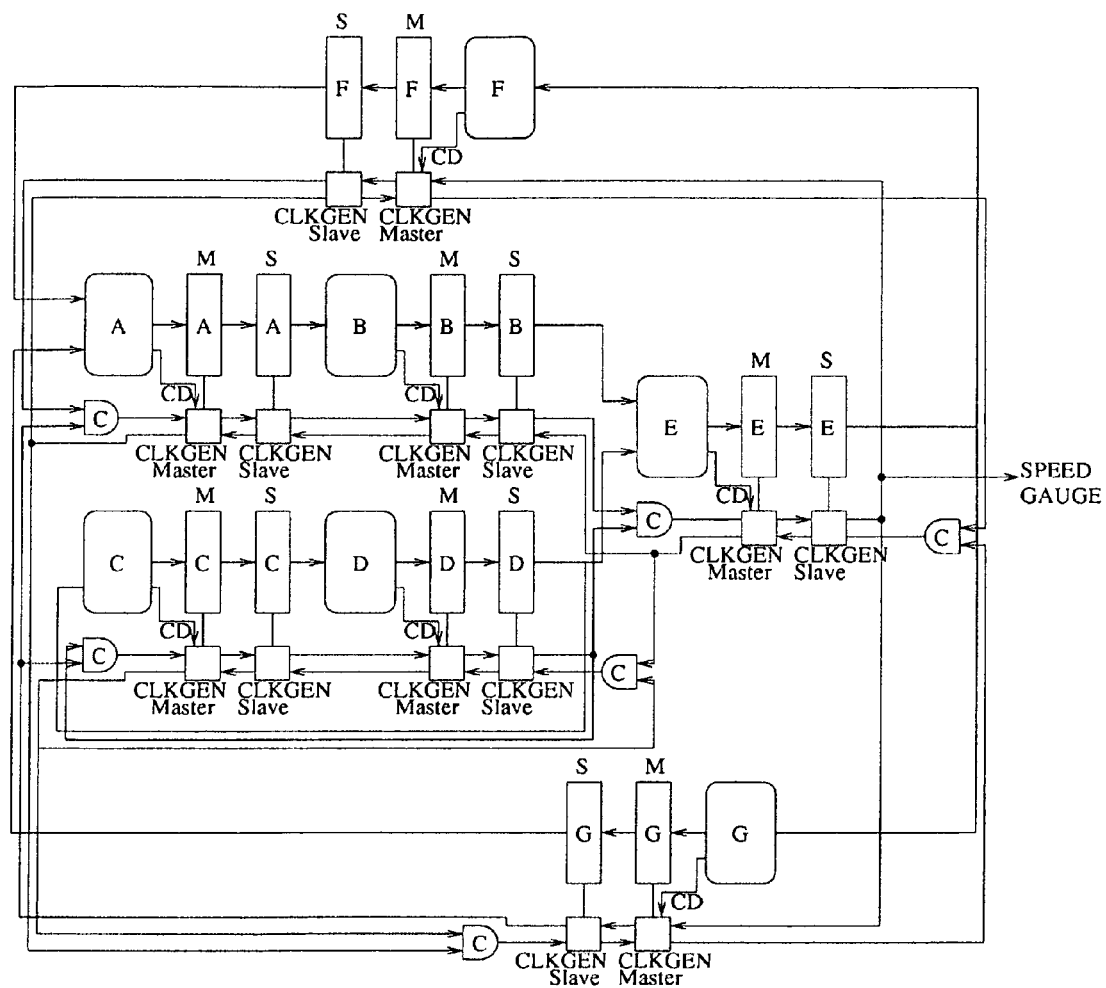

The conversion of flip-flops to latches takes place to remove skew constraints between neighboring groups of sequential elements controlled by the clock generators. FIGS. 3A and 3B illustrate the conversion process for a synchronous net list where flip-flops have already been converted to master-slave latches. The de-synchronization network of clock generators implements a structure, based on the structure of the original circuit, where neighboring controllers communicate with each other with a two-phase or a four-phase handshake. The handshake communication ensures that after sufficient time the cycle time of the system will settle at the speed of its slowest stage. By outputting de-synchronized clock signals externally, i.e. the Speed-Gauge signal, the internal cycle time of the ASIC can accurately and continuously be measured.

The circuit of FIG. 3B illustrates how the variable clock generators process clock signals when the corresponding flip-flops receive multiple input vectors. For example, circuit cloud E receives inputs from both slave flip-flops B and D. The master clock generator for master flip-flop E therefore receives as in input the corresponding variable clock signals for slave flip-flops B and D as processed by a Muller C gate.

The running speed of circuit 100 is self-adjusting for changes in the voltage of the applied power supply. It is well known that asynchronous circuits will process signals faster when the voltage of the power supply is increased, and slower when the power supply of the voltage is decreased. This change in rate of processing causes a corresponding change in the rate of the generation of the completion detection signals. This in turn causes a corresponding change in the clock signals. Thus, if the applied power supply voltage increases, circuit clouds 106 will process signals faster, the completion detection signals will be generated sooner, and the overall clock speed will increase. Similarly, if the applied power supply voltage decreases, circuit clouds 106 will process signals slower, the completion detection signal will be generated later, and the clock speed will decrease.

Figure 4A:
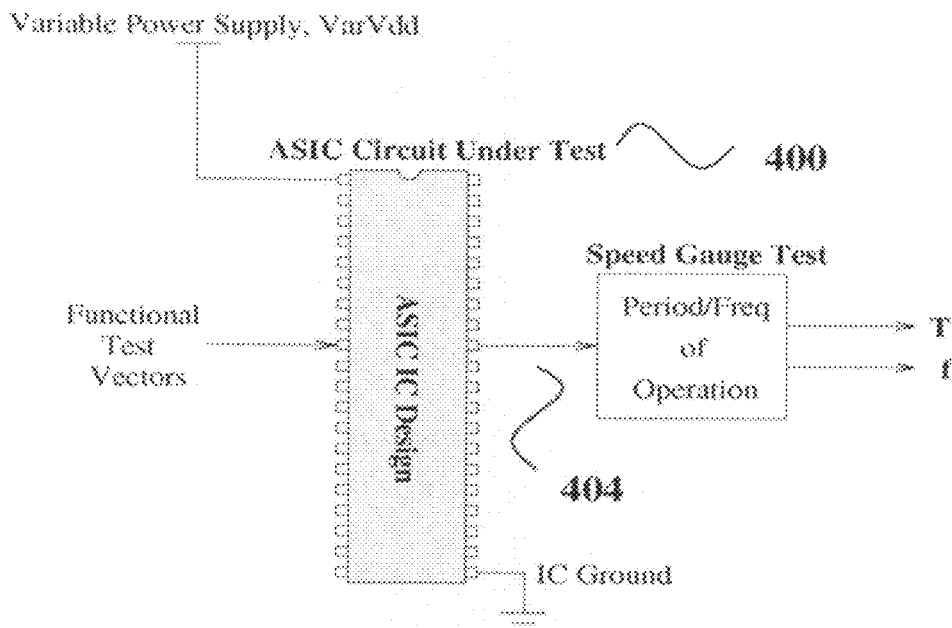
FIGS. 4A and 4B illustrates applying one ore more input vectors to an integrated circuit chip and monitoring the resulting clock speed as an output under variable power supply conditions.
Figure 4B:
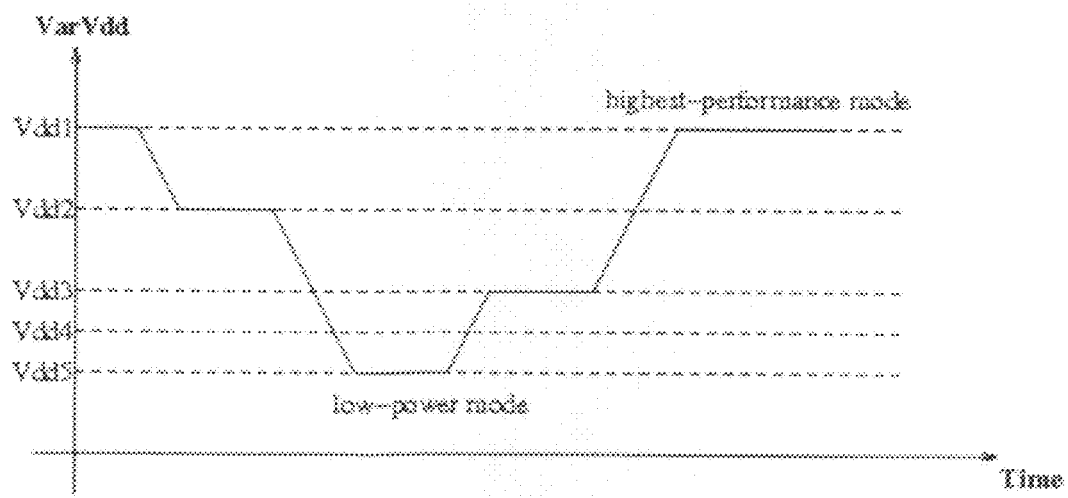

Referring now to FIGS. 4A and 4B, the relationship between power supply voltage and processing speed allows for several useful applications. An example would be to set the power supply voltage 400 to create specific clock speeds, or vice versa, based on external conditions. The graph in FIG. 4B shows the effect of several different applied voltage levels. When speed is paramount and/or power constraints is not at issue, then the highest performance mode, i.e., the fastest speed, can be set at the highest power supply voltage level Vdd1. When speed is less necessary and/or power conservation is a concern, then the voltage can be lowered all the way down to Vdd5 to enter into a low-power mode (e.g., a standby mode). Since the speed of the chip is based on the output clock signal 404, the user can ensure that the changes in power supply voltage 400 produce the desired or necessary speed for the particular mode of interest.

Another example of such an application is to ensure that an IC meets a certain minimum standards. For example, a customer may place an order for chips that operate at a certain minimum speed regardless of operating conditions, including drops in power supply voltage. While circuit 100 may meet that minimum under a nominal power supply voltage +5 v, it may not be able to do so with less power. The speed of the chip can easily be tested by simply lowering the power supply voltage and applying the appropriate test vectors.

The running speed of circuit 100 is also self-adjusting for changes in temperature. Higher temperatures can cause the circuits to operate slower, while lower temperatures can cause the circuits to operate faster. Since the internal clocks are inherently dependent upon the processing time of the circuit clouds 106, the clock speed will self-adjust to accommodate any changes in processing speed induced by changes in temperature.

Figure 5:
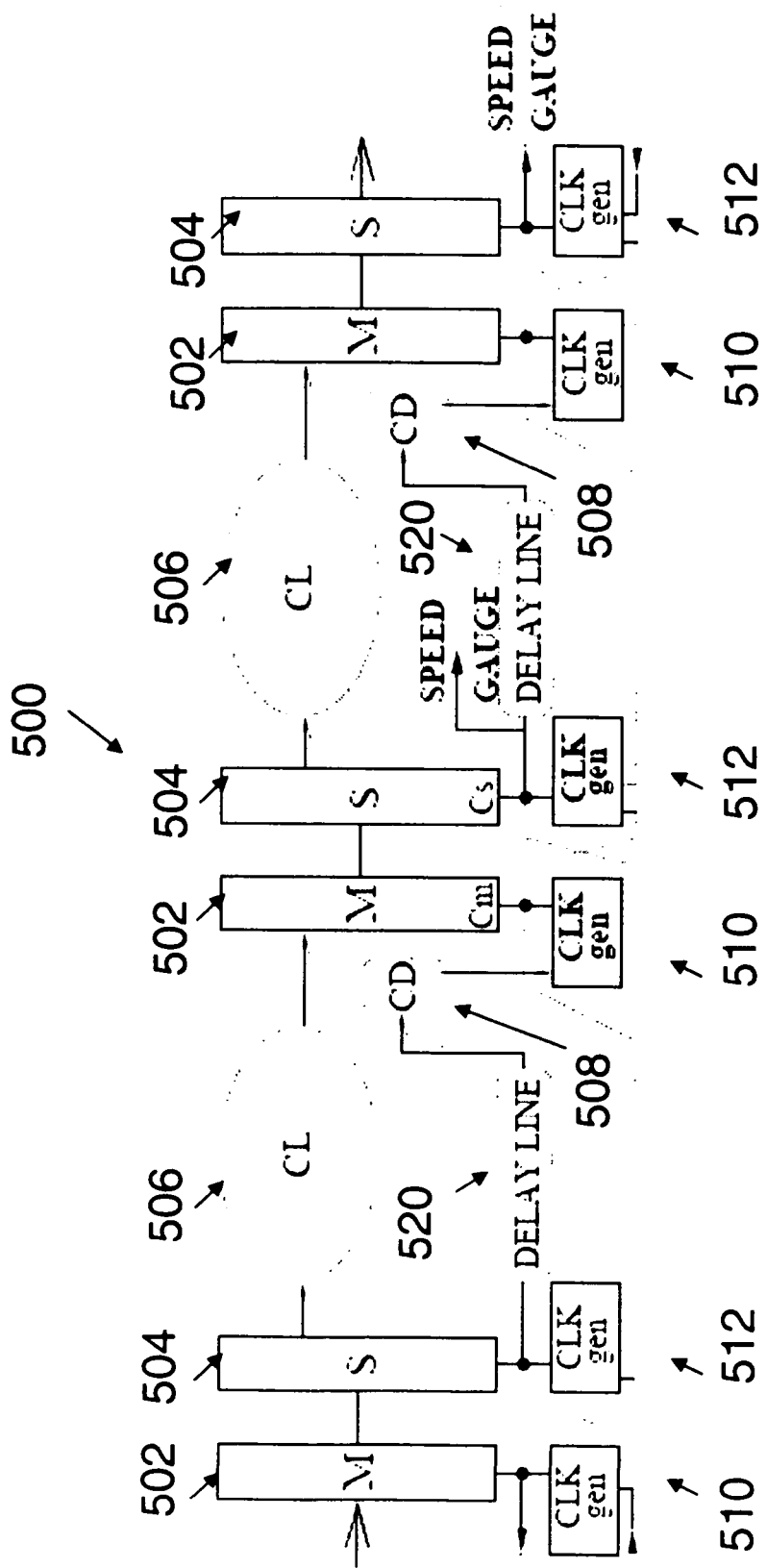
FIG. 5 illustrates a block diagram of an embodiment of the invention using matched delays in a linear pipeline configuration.
Figure 6:
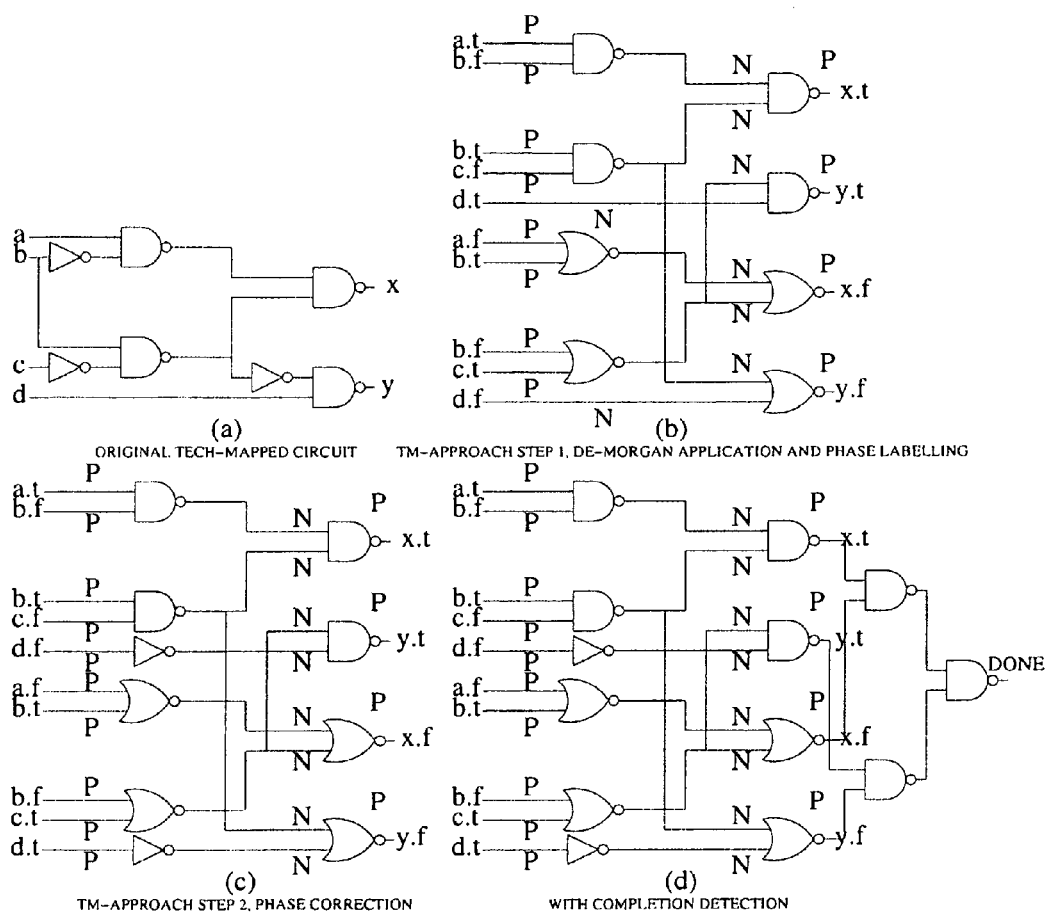
FIGS. 6A-6D illustrate transformation of a Boolean logic circuit into a dual-rail circuit with completion detection.

FIG. 5 shows another embodiment of a linear pipeline structure collectively as circuit 500. A master flip-flop 502 receives input data from an upstream source. The data passes to a slave flip-flop 504, which in turn passes the input data to a circuit cloud 506. Circuit cloud 506 is preferably an asynchronous dual-rail monotomic circuit which process the input data into one or more output signals, but may be any kind of asynchronous or synchronous logic. The output signals then pass to both the next downstream master flip-flop 502 in the pipeline.

A master clock generator 510 provides the clock for master flip flop 502, and a slave clock generator 512 provides the clock for slave flip-flop 504. Both are variable clocks in that their speed is adjustable based on their inputs. Master clock generator 510 receives as inputs (a) the completion detection signal from completion detection circuitry 508 upstream from the corresponding master flip-flop 502, and (b) the clock signal from slave clock generator 512 for the corresponding downstream slave flip-flop 504. Slave clock generator 512 receives as its inputs the clock signal from the master clock generators 512 for both the corresponding upstream and downstream master flip-flops 502.

The clock signal for slave clock generator 514 for the slave flip-flop 504 is input to delay circuitry 520. Delay circuitry 520 applies a delay to the applied clock signal before outputting a delayed clock signal to completion detection circuitry 508. Delay circuit 520 is designed to mimic the processing speed delay of its associated circuit cloud 506. More specifically, any particular circuit cloud 506 will have maximum processing delay based on its critical path(s) and the time it would take to process worst-case functional test vectors. That processing delay can be estimated and/or calculated, and delay circuitry 520 can be designed with at least that delay. The delay within the individual delay lines 520 may be the same or different. Regardless, the overall running speed of the circuit will be set by the particular delay circuit(s) 520 that have the longest delay.

Delay circuitry 520 can be constructed in several different ways. One non-limiting example is to use a single gate which is replicated a sufficient amount of times as to yield the required delay, or using a mixture of gates from the critical paths of the circuit, in order to track better any variations in the delays of the critical paths. If de-synchronization two-phase handshaking is employed, then the delay elements are preferably symmetric, i.e. the 1→0 delay is the same as the 0→1 delay. If de-synchronization four-phase handshaking is employed, then the delay elements are preferably asymmetric, i.e. the 1→0 delay must be fast, whereas the 0→1 delay must reflect the delay of the critical path (if the delay element is active-low the delays may be reversed).

Completion detection circuitry 508 is preferably much simpler than that of completion detection circuitry 108 of FIG. 1. A simple buffer, or even just a wire to carry the clock signal, may be sufficient.

Circuit 500 presents different advantages and disadvantages compared with circuit 100. Circuit 500 provides greater flexibility in the logic design, as any type of logic or circuit elements can be used, whereas circuit 100 is preferably multi-rail monotonic asynchronous logic. Circuit 100 provides greater accuracy in its minimum running speed because it is based directly on the operation of the circuit clouds 106 whereas circuit 500 is based on approximations of the delays of circuit clouds 506. Circuit 100 also self-adjusts its clock based on the demands of the input data, whereas circuit 500 cannot exceed the speed of the slowest pre-set delay regardless of whether the circuit clouds 506 are operating faster than that delay.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

By way of non-limiting example, while the above block diagrams of the above figures illustrate divisions of functionality, they should not be construed as divisions in layout. It is well known in the art of circuit design and construction that circuit elements from different functional sub-blocks can be integrated and laid out as needed without regards for functional distinctions. Thus for example, there may one appear to be a single large circuit, even though various individual circuit elements are working collectively for their individual functions.

What is claimed is:

1. A system for identifying a running speed of an integrated circuit, comprising:

at least first and second asynchronous multi-rail circuits configured to receive input data and transmit output data;

at least first and second completion detection circuits configured to generate at least first and second completion detection signals for said at least first and second asynchronous circuits, respectively;

at least first and second variable clock generators configured to be driven by at least said at least first and second completion detection signals, respectively;

a synchronous circuit element configured to receive at least a portion of said output data and configured to be clock driven by a clock signal from at least one said first and second variable clock generators;

wherein said at least first and second variable clock generators will self-adjust toward a universal clock speed that represents a running speed of said asynchronous circuit.

2. The system of claim 1, wherein said synchronous circuit element is a flip-flop.

3. The system of claim 1, further comprising:

a variable power supply configured to power said asynchronous multi-rail circuit; and wherein said running speed of said circuit increases in response to increases in said variable power supply, and decreases in response to decreases in said variable power supply.

4. The system of claim 1, wherein said asynchronous multi-rail circuit is monotomic.

5. The system of claim 1 wherein:

said first variable clock generators receives clock signals from adjacent upstream and downstream clock generators.

6. The system of claim 1 wherein:

said asynchronous multi-rail circuit has a critical path;

wherein said running speed is at a minimum when a critical input vector is applied to said asynchronous multi-rail circuit.

7. The system of claim 1, wherein:

said at least first and second asynchronous multi-rail circuits contain at least one critical path;

wherein said running speed is at a minimum in response to a critical input vector under ambient external conditions.

* * * * *